United States Patent
Joshi et al.

(10) Patent No.: US 7,186,663 B2
(45) Date of Patent: Mar. 6, 2007

(54) HIGH DENSITY PLASMA PROCESS FOR SILICON THIN FILMS

(75) Inventors: Pooran Chandra Joshi, Vancouver, WA (US); Apostolos T. Voutsas, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/871,939

(22) Filed: Jun. 17, 2004

(65) Prior Publication Data

US 2005/0202653 A1    Sep. 15, 2005

Related U.S. Application Data

(63) Continuation-in-part of application No. 10/812,591, filed on Mar. 29, 2004, and a continuation-in-part of application No. 10/801,377, filed on Mar. 15, 2004, and a continuation-in-part of application No. 10/801,374, filed on Mar. 15, 2004.

(51) Int. Cl.
    *H01L 21/31* (2006.01)
(52) U.S. Cl. ............ 438/758; 438/767; 438/788; 257/E21.274; 427/452
(58) Field of Classification Search ........... 438/758, 438/762, 767, 788; 427/452; 257/E21.274
    See application file for complete search history.

(56) References Cited

U.S. PATENT DOCUMENTS

| | | | | |
|---|---|---|---|---|
| 5,891,349 A | * | 4/1999 | Tobe et al. | 216/68 |
| 5,950,078 A | * | 9/1999 | Maekawa et al. | 438/149 |
| 2002/0160553 A1 | * | 10/2002 | Yamanaka et al. | 438/149 |
| 2003/0022519 A1 | * | 1/2003 | Fujioka et al. | 438/758 |
| 2004/0253759 A1 | * | 12/2004 | Garber et al. | 438/46 |

OTHER PUBLICATIONS

U.S. Appl. No. 60/477,752.*

* cited by examiner

*Primary Examiner*—Brook Kebede
(74) *Attorney, Agent, or Firm*—Law Office of Gerald Maliszewski; Gerald Maliszewski

(57) ABSTRACT

A method is provided for forming a Si and Si—Ge thin films. The method comprises: providing a low temperature substrate material of plastic or glass; supplying an atmosphere; performing a high-density (HD) plasma process, such as an HD PECVD process using an inductively coupled plasma (ICP) source; maintaining a substrate temperature of 400 degrees C., or less; and, forming a semiconductor layer overlying the substrate that is made from Si or Si-germanium. The HD PECVD process is capable of depositing Si at a rate of greater than 100 Å per minute. The substrate temperature can be as low as 50 degrees C. Microcrystalline Si, a-Si, or a polycrystalline Si layer can be formed over the substrate. Further, the deposited Si can be either intrinsic or doped. Typically, the supplied atmosphere includes Si and H. For example, an atmosphere can be supplied including SiH4 and H2, or comprising H2 and Silane with H2/Silane ratio in the range of 0–100.

25 Claims, 3 Drawing Sheets

HIGH DENSITY PLASMA PROCESS FOR SILICON THIN FILMS

RELATED APPLICATIONS

This application is a continuation-in-part of a pending patent application entitled, METHODS FOR FABRICATING OXIDE THIN FILMS, invented by Joshi et al., Ser. No. 10/801,374, filed Mar. 15, 2004.

This application is a continuation-in-part of a pending patent application entitled, DEPOSITION OXIDE WITH IMPROVED OXYGEN BONDING, invented by Pooran Joshi, Ser. No. 10/801,377, filed Mar. 15, 2004.

This application is a continuation-in-part of a pending patent application entitled, HIGH DENSITY PLASMA PROCESS FOR THE FORMATION OF SILICON DIOXIDE ON SILICON CARBIDE SUBSTRATES, invented by Joshi et al., Ser. No. 10/812,591, filed Mar. 29, 2004.

BACKGROUND OF THE INVENTION

1. Field of the Invention

This invention generally relates to integrated circuit (IC) fabrication and, more particularly, to a system and method for forming silicon-containing films at low process temperatures using a high density plasma source.

2. Description of the Related Art

Conventional plasma-enhanced chemical vapor deposition (PECVD) processes using capacitively coupled plasma (CCP) plasma are suitable for the deposition of amorphous silicon (a-Si) thin films. These suitable for the deposition of amorphous silicon (a-Si) thin films. These conventional PECVD processes typically induce high hydrogen content into the film, necessitating a post-deposition thermal treatment to reduce the amount of hydrogen content.

Microcrystalline thin films with large sized grains are preferred for many applications. The carrier mobility of transistors fabricated with a-Si is poor, insufficient for LCD driver circuits. The carrier mobility is enhanced by using crystalline silicon thin films. A crystalline Si thin film provides significantly higher circuit performance, as compared to a-Si thin films.

The laser crystallization of a-Si thin film is often carried out to enhance the grain growth for high performance circuits. Sometimes impurities, such as Ni, are added in the a-Si thin films to enhance the laser crystallization kinetics. A high quality microcrystalline Si film, without impurities, is preferable for laser crystallization, as the step of incorporating any foreign impurities is eliminated. Impurity contamination can severely degrade the device performance. If the microcrystalline silicon film has a suitable crystallite size and high crystalline volume fraction, it can be used as a seed to achieve large grain growth by laser crystallization, without adding any impurities in the silicon film prior to laser crystallization.

High hydrogen dilution of the plasma is required to enhance the crystallite size in the deposited films. For this reasons, PECVD processes are often used. However, as mentioned above, there are also disadvantages associated with the use of a relatively high hydrogen concentration. These a-Si thin films require a high thermal budget dehydrogenation process prior to laser crystallization. These high thermal budget processes are not particularly suitable for Si deposition on low temperature substrates such as glass or plastic.

In general, hydrogen is required in the plasma, in addition to silicon precursor, to induce crystallization. The crystallite size and the microcrystalline volume fraction is enhanced in response to a more efficient and active hydrogen plasma. A high-density plasma process significantly enhances the plasma density and energy while minimizing the plasma damage. A more active hydrogen specie can significantly enhance the grain growth at lower temperatures.

It would be advantageous if low temperature processes could be developed for the deposition of a-Si thin films.

It would be advantageous if the thermal budget associated with the fabrication of microcrystalline films could be reduced through the development of a low hydrogen content deposition process. Such as process would lead to significant savings, by reducing the number of process steps, and enable the fabrication of novel device structures.

It would be advantageous if a low hydrogen content, low temperature PECVD process for the deposition of a-Si could be developed.

It would be advantageous if a lower temperature H2 ionization process could be developed for the deposition of microcrystalline Si films with a low hydrogen content, large crystallite size, and high volume fraction in the fabrication of high performance components for LCD devices integrated on low temperature substrates.

SUMMARY OF THE INVENTION

The present invention describes a novel deposition method for the fabrication of Si thin films by high-density plasma-based processes, employing an inductively coupled plasma source. The high-density plasma processes generate high electron/ion concentrations, with suitable electron temperatures, to enhance the deposition of Si. The high-density plasma process is characterized by high electron/ion concentration, low plasma potential, and independent control of plasma energy and density. The high electron/ion energy, low plasma potential, and high electron temperature of the high-density ICP plasma process make it possible to fabricate Si thin films with significantly lower thermal budgets, as compared to the conventional processes, and plasma-based physical and chemical techniques.

Accordingly, a method is provided for forming a semiconductor thin film. The method comprises: providing a low temperature substrate material of plastic or glass; supplying an atmosphere; performing a high-density (HD) plasma process, such as an HD PECVD process using an inductively coupled plasma (ICP) source; maintaining a substrate temperature of 400 degrees C., or less; and, forming a semiconductor layer overlying the substrate that is made from Si or Si-germanium.

The HD PECVD process is capable of depositing Si at a rate of greater than 100 Å per minute. The substrate temperature can be as low as 50 degrees C. A microcrystalline Si, a-Si, or polycrystalline Si layer can be formed over the substrate. Further, the deposited Si can be either intrinsic or doped. Typically, the supplied atmosphere includes Si and H. For example, an atmosphere can be supplied including SiH4 and H2, or comprising H2 and Silane with H2/Silane ratio in the range of 0–100.

In other aspects, the method further comprises: periodically exposing a formed semiconductor Si layer to H2 plasma, so that the step of forming a semiconductor Si layer overlying the substrate includes forming Si layers between exposures to the H2 plasma. Again, the H2 plasma can be generated using an ICP source.

Additional details of the above-described methods are provided below.

DETAILED DESCRIPTION OF THE PREFERRED EMBODIMENTS

Figure 1:
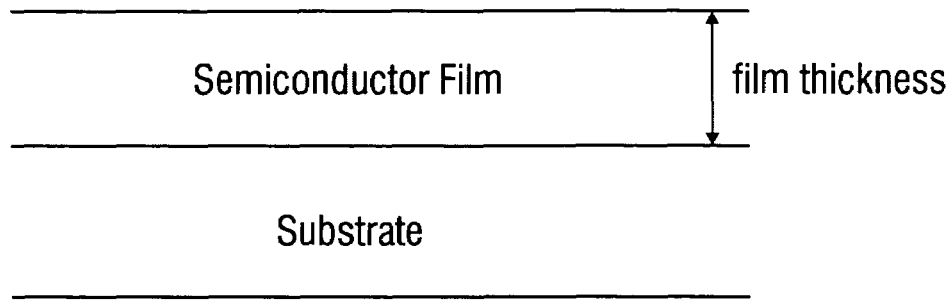
FIG. 1 is a partial cross-sectional view of the semiconductor film formed using the present invention low temperature, HD plasma deposition process.

FIG. 1 is a partial cross-sectional view of the semiconductor film formed using the present invention low temperature, HD plasma deposition process.

Figure 2:
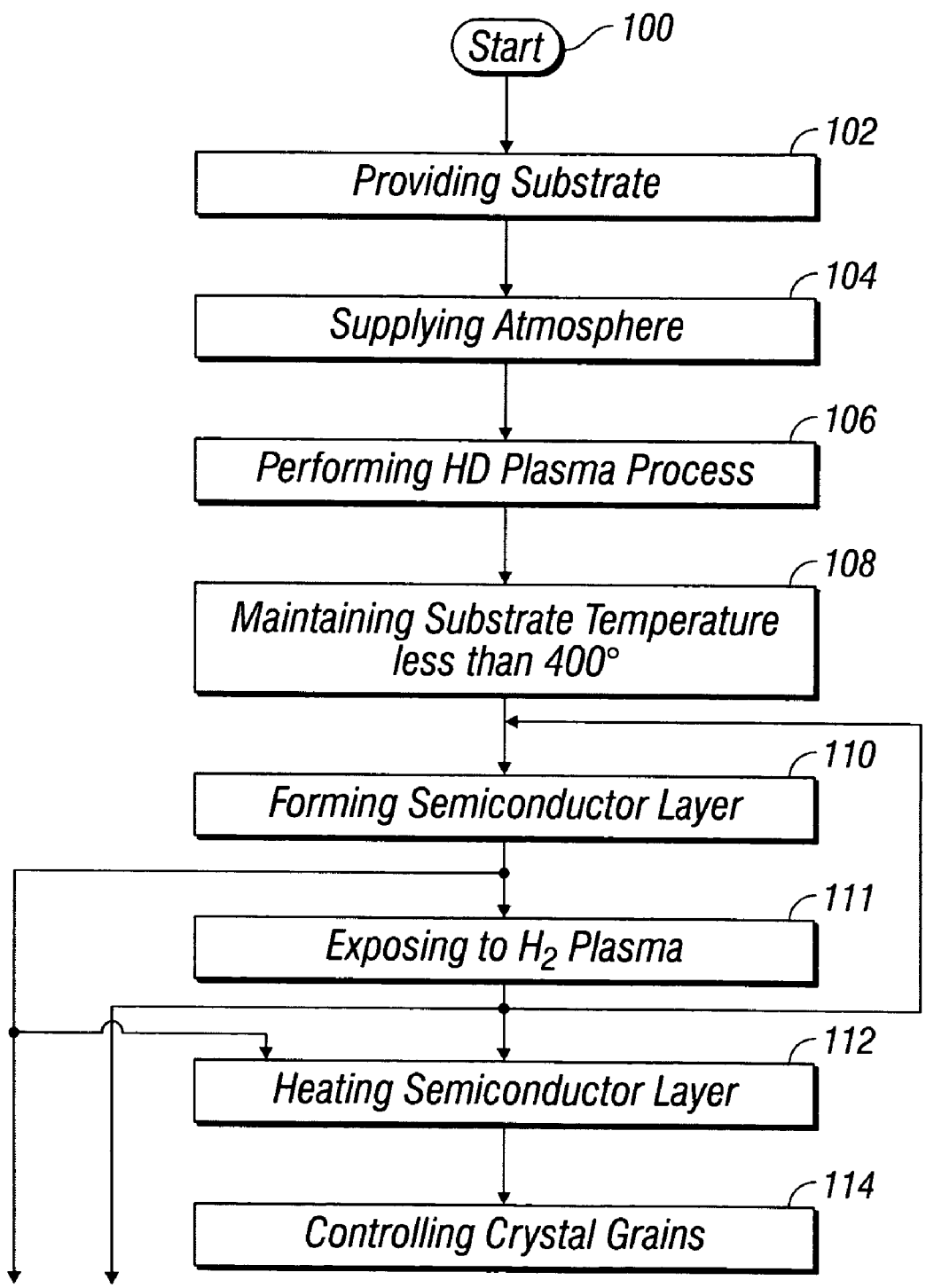
FIG. 2 is a flowchart illustrating the present invention method forming a semiconductor thin film.

FIG. 2 is a flowchart illustrating the present invention method forming a semiconductor thin film. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 100.

Step 102 provides a substrate. Although the invention is not necessarily so limited, it is especially advantageous for use with low-temperature glass or plastic substrates, as might be used LCD fabrication. Step 104 supplies an atmosphere. Step 106 performs a high-density (HD) plasma process. Step 108 maintains a substrate temperature of 400 degrees C., or less. Again, the process it not limited to temperatures below 400, but rather, is especially advantageous for use with materials that are not able to withstand higher substrate temperatures. In some aspects, the substrate temperature is maintained in the range of 50 to 400 degrees C. Step 110 forms a semiconductor layer overlying the substrate made from a material such as silicon (Si) or Si-germanium (Si—Ge). Typically, the semiconductor layer has a thickness in the range of 10 Å to 1 micron (see FIG. 1).

In one aspect, forming a semiconductor layer overlying the substrate in Step 110 includes forming a Si layer that can be amorphous, nanocrystalline, or polycrystalline in structure. For example, a microcrystalline Si layer may have microcrystallites with an average grain size in the range of 10 to 500 Å. If an a-Si is formed, the amorphous Si layer may have a crystalline volume fraction in the range of 0 to 90%. In a different aspect, Step 110 forms a Si layer that is either doped or intrinsic Si.

Figure 3:
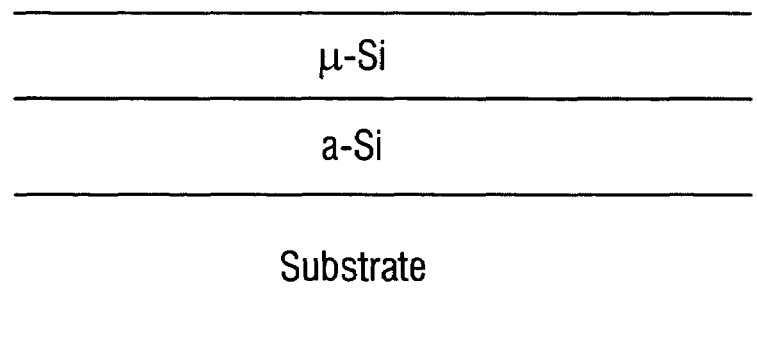
FIG. 3 is a partial cross-sectional view of a bi-layer Si film formed using the present invention HD plasma deposition process.

FIG. 3 is a partial cross-sectional view of a bi-layer Si film formed using the present invention HD plasma deposition process. In this aspect, Step 110 forms a multilayer Si film including a layer of microcrystalline Si (μ-Si) and a layer of amorphous Si (a-Si). Note, although the μ-Si layer is shown overlying the a-Si layer, the layers may be in either order, and the Si film may be comprised of a plurality of these bi-layers.

Returning to FIG. 2, performing a HD plasma process in Step 106 may include the performance of an HD PECVD process. In some aspects, the HD-PECVD process of Step 106 deposits Si at a rate of greater than 100 Å per minute. Further, the HD PECVD process may connect a top electrode to an inductively coupled HD plasma source.

Figure 4:
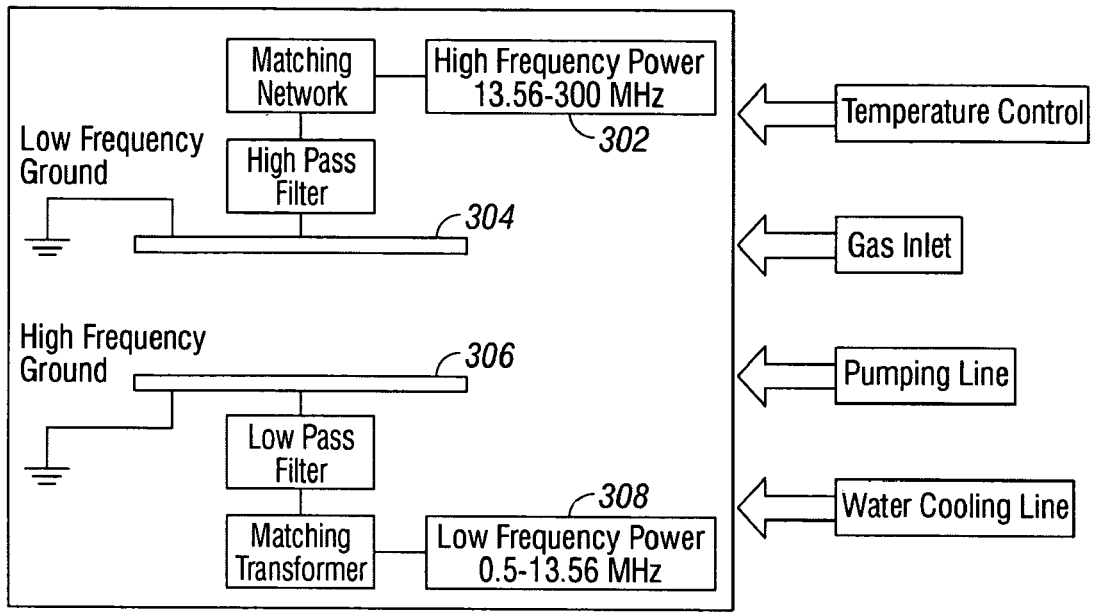
FIG. 4 is a schematic block diagram of an inductively coupled high-density plasma source.

FIG. 4 is a schematic block diagram of an inductively coupled high-density plasma source. Shown is an ICP source 302, a top electrode 304, and bottom electrode 306, and a bottom electrode source 308. Although an inductively coupled source is shown, the present invention process can be enabled using any suitable high-density (HD) plasma source. Returning to FIG. 2, performing an HD PECVD process in Step 106 may include substeps (not shown). Step 106a locates the substrate between a bottom electrode and the top electrode. Step 106b supplies a power density in the range of 0 to 10 W/cm$^2$, at a frequency in the range of 13.56 to 300 MHz, to the top electrode. Step 106c supplies a power density in the range of 0 to 3 W/cm$^2$, at a frequency in the range of 50 KHz to 13.56 MHz, to the bottom electrode.

In some aspects supplying an atmosphere in Step 104 includes supplying an atmosphere including SiH4 and H2. In another aspect, Step 104 supplies an atmosphere including Si and H. For example, the atmosphere may include $Si_NH_{2N+2}$. In a second example, the atmosphere comprises H2 and Silane with H2/Silane ratio in the range of 0–100. In one aspect the H2/Silane ratio is 20, or less. Then, forming a semiconductor layer overlying the substrate in Step 110 includes forming a Si layer having an average crystal grain size of at least 100 Å and a crystalline volume fraction of 75%, or greater (see FIG. 5).

In a third example, the atmosphere comprises He gas with H2/(Silane+He) ratio in the range of 0–200. In a fourth example, the atmosphere comprises H2/(Silane+inert gas) ratio in the range of 0–200, where the inert gas is gas such as Ar or Kr. In a different aspect, supplying an atmosphere in Step 104 includes supplying an atmosphere at a pressure in the range of 10 to 500 milliTorr (mT).

In some aspects the method comprises a further step, Step 111 of periodically exposing a formed semiconductor Si layer to H2 plasma. Then, Step 110 forms a semiconductor Si layer overlying the substrate between exposures to the H2 plasma in Step 111.

Periodically exposing the formed Si layer to H2 plasma in Step 111 may includes generating H2 plasma in response to powering either an inductively coupled plasma (ICP) top electrode, or an ICP top electrode in combination with a bottom electrode underlying the substrate (see FIG. 4).

For example, periodically exposing the formed Si layer to H2 plasma in Step 111 may include substeps (not shown). Step 111a biases an ICP top electrode, with a power density of up to 10 watts per square centimeter (W/cm$^2$), at a frequency in the range of 13.56 megahertz (MHz) to 300 MHz. Step 111b creates a hydrogen gas flow in the range of 1–1000 sccm, with a pressure up to 500 mTorr. Step 111c biases the substrate lower electrode with a power density up to 3 W/cm$^2$, at a frequency in the range of 50 KHz to 13.56 MHz.

In a different aspect the further comprises Steps 112 and 114. Step 112 heats the semiconductor layer using a furnace annealing, rapid thermal annealing (RTA), or laser annealing process. Step 114 controls the crystal grain (size) in response to the annealing.

The present invention methods describe high-density plasma deposition process using an inductively coupled plasma (ICP) source. High electron/ion concentrations are generated, with high electron temperatures sufficient to enhance the deposition process, by creating highly reactive precursor fragments. The high-density plasma process is effective in enhancing the deposition kinetics even when low thermal energies are supplied to the substrate. The high-density plasma process is carried out at low pressures to achieve high electron density (>$10^{10}$ cm$^{-3}$), which significantly reduces particle generation during the process. One of the significant characteristics of the high-density plasma process is the low plasma potential, which makes it possible to independently control the substrate bias. Independent control of the plasma energy and density make possible better deposition kinetics, as well as better Si bulk and interfacial properties.

The present invention high-density plasma deposition concepts have also been successfully applied to the growth of SiO$_2$ thin films on Si substrates, as well as the growth/deposition of silicon oxide films overlying a SiC substrate. The pending patent applications mentioned in the Related Applications Section above, namely METHODS FOR FABRICATING OXIDE THIN FILMS, invented by Joshi et al., DEPOSITION OXIDE WITH IMPROVED OXYGEN BONDING, invented by Pooran Joshi, and HIGH DENSITY PLASMA PROCESS FOR THE FORMATION OF SILICON DIOXIDE ON SILICON CARBIDE SUBSTRATES, invented by Joshi et al., are incorporated herein by reference.

In these applications, the growth of SiO$_2$ by oxidation of a Si surface is analyzed using various combinations of inert gas (such as He, Kr, or Ar) and O$_2$. The wafer temperature is maintained at 360° C. and energy is inductively coupled plasma at 13.56 MHz, at a power density of 1.6 W/cm$^2$.

The ICP is a linear source that can be scaled-up for large area processing. Although the invention has been explained in the context of an ICP source, the high-density plasma processes described above can be carried out using any high-density plasma source capable of generating electron concentrations of higher than $10^{10}$ cm$^{-3}$, and an electron temperature sufficient to generate reactive precursor species for the deposition of Si or Si—Ge thin films.

The high density PECVD process is suitable for the deposition of low temperature a-Si or microcrystalline Si thin films because of its high plasma concentration and energy. The HD PECVD process additionally offers the independent control of plasma energy and density. The present invention HD plasma process also reduces the hydrogen content in deposited a-Si films. The high plasma density and energy result in efficient ionization of the Si precursor and other process gases, leading to the minimal incorporation of hydrogen-related bonds in the deposited films. The top and bottom electrode powers can be adjusted to efficiently ionize the plasma and reduce the incorporation of the hydrogen-related bonds in the gas phase and surface reactions.

The microcrystalline silicon thin films are conventionally fabricated by high temperature ionization of H2. The process involves high temperature and safety hazards. The present invention HD plasma process can be effective in the low temperature ionization of H2 gas, which is required to induce crystalline phase. The low temperature fabrication of microcrystalline Si thin films also enables the fabrication of novel device structures, resulting in significant cost savings. A microcrystalline Si mobility, higher than that of a-Si, significant impacts TFT device development, as a higher level of integration and driver fabrication is made possible.

The main points of the HD-PECVD a-Si and μ-Si thin film processes are summarized below:

The low temperature (<400° C.) fabrication of a-Si and μ-Si thin films is possible using SiH$_4$ and H$_2$ plasma;

a-Si and μ-Si thin films can be deposited employing an inert gas, H$_2$, and SiH$_4$ plasma;

a-Si and μ-Si thin films can be deposited using a dual frequency configuration;

The hydrogen content of the deposited a-Si thin films can be made low;

Low temperature μ-Si thin films with low hydrogen content can be fabricated—there are various schemes provided for adjusting power at both the electrodes, and switching between the silane and hydrogen plasma to induce crystallization;

Sequential processing can be used to fabricate various TFT device layers, for either a top and bottom gate TFT, including gate oxide, diffusion barrier, active layer, and interlayer dielectric layers;

Sequential processing of various device layers can be performed using a combination of HD plasma growth and deposition processes;

A cluster tool approach can be used to fabricate various TFT device layers using HD plasma-based processes;

HD plasma doping can be used to fabricate doped Si layers;

Various devices can be fabricated using low temperature amorphous and microcrystalline Si thin films; and, An a-Si/μ-Si double junction can be fabricated for use in solar cells, for example.

Figure 5:
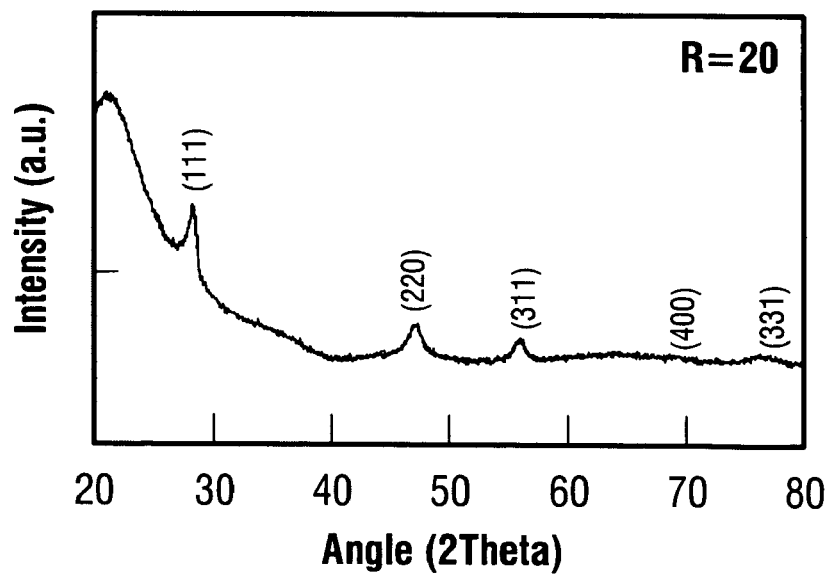
FIG. 5 is a graph depicting an X-ray diffraction analysis of a Si film deposited using the present invention process.

FIG. 5 is a graph depicting an X-ray diffraction analysis of a Si film deposited using the present invention process. The films deposited at R=20 show a well-crystallized phase with peaks corresponding to crystalline Si only. The average crystallite size measured from the <111> peak is greater than 100 Å. The Raman spectra of the same film (deposited at R=20) shows a microcrystalline phase with crystalline volume fraction greater than 75%.

Methods have been provided for the formation of Si and Si—Ge films using a variety of HD plasma-based processes. Process specifics have been described to help clarify the various aspects of the invention, but the invention is not limited to merely these examples. Neither is the invention necessarily limited to just the deposition of Si and Si—Ge films, but rather, is applicable to any semiconductor film including Si. Other variations and embodiments of the invention will occur to those skilled in the art.

We claim:

1. A method for forming a semiconductor thin film, the method comprising:
   providing a substrate;
   supplying an atmosphere with a hydrogen partial pressure;
   performing a high-density (HD) plasma enhanced chemical vapor deposition (PECVD) process, connecting a top electrode to an inductively coupled HD plasma source, as follows:
      locating the substrate between a bottom electrode and the top electrode;
      supplying a power density in the range of 0 to 10 W/cm$^2$, at a frequency in the range of 13.56 to 300 MHz, to the top electrode; and,
      supplying a power density in the range of 0 to 3 W/cm$^2$, at a frequency in the range of 50 KHz to 13.56 MHz, to the bottom electrode;
   maintaining a substrate temperature of 400 degrees C., or less; and,
   forming a hydrogenated semiconductor layer overlying the substrate selected from the group including silicon (Si) and Si-germanium.

2. The method of claim 1 wherein forming a hydrogenated semiconductor layer overlying the substrate includes forming a Si layer with a structure selected from the group including amorphous, nanocrystalline, and polycrystalline.

3. The method of claim 1 wherein providing a substrate includes providing a substrate material selected from the group including glass and plastic.

4. The method of claim 1 wherein performing a HD-PECVD process includes depositing Si at a rate of greater than 100 Å per minute.

5. The method of claim 1 wherein maintaining a substrate temperature of 400 degrees C., or less, includes maintaining a temperature in the range of 50 to 400 degrees C.

6. The method of claim 1 wherein forming a hydrogenated semiconductor layer overlying the substrate includes forming a Si layer selected from the group including doped and intrinsic Si.

7. The method of claim 1 wherein forming a hydrogenated semiconductor layer overlying the substrate includes forming a multilayer Si film including a layer of microcrystalline Si (µ-Si) and a layer of amorphous Si (a-Si).

8. The method of claim 1 wherein supplying an atmosphere with a hydrogen partial pressure includes supplying an atmosphere including SiH4 and H2.

9. The method of claim 1 wherein supplying an atmosphere with a hydrogen partial pressure includes supplying an atmosphere comprising H2 and Silane with the H2/Silane ratio in the range of 0–100.

10. The method of claim 9 wherein supplying an atmosphere comprising H2 and Silane with the H2/Silane ratio in the range of 0–100 includes supplying a ratio of 20, or less; and, wherein forming a hydrogenated semiconductor layer overlying the substrate includes forming a Si layer having an average crystal grain size of at least 100 Å and a crystalline volume fraction of 75%, or greater.

11. The method of claim 1 wherein supplying an atmosphere with a hydrogen partial pressure includes supplying an atmosphere comprising a H2/(Silane+inert gas) ratio in the range of 0–200, where the inert gas is selected from the group including Ar and Kr.

12. The method of claim 8 further comprising:

periodically exposing a formed semiconductor Si layer to H2 plasma; and, wherein forming a hydrogenated semiconductor Si layer overlying the substrate includes forming Si layers between exposures to the H2 plasma.

13. The method of claim 12 wherein periodically exposing the formed Si layer to H2 plasma includes generating H2 plasma in response to powering:

an inductively coupled plasma (ICP) top electrode; and, an ICP top electrode in combination with a bottom electrode underlying the substrate.

14. The method of claim 12 wherein periodically exposing the formed Si layer to H2 plasma includes:

biasing an ICP top electrode, with a power density of up to 10 watts per square centimeter (W/cm$^2$), at a frequency in the range of 13.56 megahertz (MHz) to 300 MHz;

creating a hydrogen gas flow in the range of 1–1000 sccm, with a pressure up to 500 mTorr; and, biasing the substrate lower electrode with a power density up to 3 W/cm$^2$, at a frequency in the range of 50 KHz to 13.56 MHz.

15. The method of claim 1 wherein supplying an atmosphere with a hydrogen partial pressure includes supplying an atmosphere at a pressure in the range of 10 to 500 milliTorr (mT).

16. The method of claim 1 further comprising:

heating the hydrogenated semiconductor layer using a process selected from the group including furnace annealing, rapid thermal annealing (RTA), and laser annealing; and, controlling the crystal grain in response to the annealing.

17. The method of claim 2 wherein forming a Si layer with a structure selected from the group including amorphous, nanocrystalline, and polycrystalline includes forming a microcrystalline Si layer having microcrystallites with an average grain size in the range of 10 to 500 Å.

18. The method of claim 2 wherein forming a Si layer with a structure selected from the group including amorphous, nanocrystalline, and polycrystalline includes forming an amorphous Si layer having a crystalline volume fraction in the range of 0 to 90%.

19. The method of claim 1 wherein supplying an atmosphere with a hydrogen partial pressure includes supplying an atmosphere including Si and H$_2$.

20. The method of claim 1 wherein supplying an atmosphere with a hydrogen partial pressure includes supplying an atmosphere including $S_{iN}H_{2N+2}$.

21. The method of claim 1 wherein forming a hydrogenated semiconductor layer overlying the substrate selected from the group including Si and Si-germanium includes forming a layer having a thickness in the range of 10 Å to 1 micron.

22. The method of claim 1 wherein supplying an atmosphere with a hydrogen partial pressure includes supplying an atmosphere comprising He gas with a H2/(Silane+He) ratio in the range of 0–200.

23. A method for forming a semiconductor thin film, the method comprising:

providing a substrate;

supplying an atmosphere with a hydrogen partial pressure;

performing a high-density (HD) plasma process;

maintaining a substrate temperature of 400 degrees C., or less; and, forming a hydrogenated multilayer silicon (Si) film overlying the substrate including a layer of microcrystalline Si (µ-Si) and a layer of amorphous Si (a-Si).

24. A method for forming a semiconductor thin film, the method comprising:

providing a substrate;

supplying an atmosphere including SiH$_4$ and H$_2$;

performing a high-density (HD) plasma process;

maintaining a substrate temperature of 400 degrees C., or less;

forming a hydrogenated silicon (Si) semiconductor layer overlying the substrate;

periodically exposing a formed semiconductor Si layer to H$_2$ plasma as follows:

biasing an ICP top electrode, with a power density of up to 10 watts per square centimeter (W/cm$^2$), at a frequency in the range of 13.56 megahertz (MHz) to 300 MHz;

creating a hydrogen gas flow in the range of 1–1000 sccm, with a pressure up to 500 mTorr; and, biasing the substrate lower electrode with a power density up to 3 W/cm$^2$, at a frequency in the range of 50 KHz to 13.56 MHz; and, wherein forming a hydrogenated semiconductor Si layer overlying the substrate includes forming Si layers between exposures to the $H_2$ plasma.

25. A method for forming a semiconductor thin film, the method comprising:
   providing a substrate;
   supplying an atmosphere with a hydrogen partial pressure;
   performing a high-density (HD) plasma process;
   maintaining a substrate temperature of 400 degrees C., or less;
   forming a hydrogenated semiconductor layer overlying the substrate selected from the group including silicon (Si) and Si-germanium; and,
   wherein supplying an atmosphere with a hydrogen partial pressure includes supplying an atmosphere comprising He gas with a H2/(Silane+He) ratio in the range of 0–200.

* * * * *